United States Patent
Cheifetz et al.

(10) Patent No.: US 10,236,155 B2
(45) Date of Patent: Mar. 19, 2019

(54) DETECTION ASSEMBLY, SYSTEM AND METHOD

(71) Applicant: EL-MUL TECHNOLOGIES LTD., Rehovot (IL)

(72) Inventors: Eli Cheifetz, Ramat Gan (IL); Amit Weingarten, Ramat Gan (IL); Semyon Shofman, Kiryat Ekron (IL); Silviu Reinhorn, Mevaseret Zion (IL)

(73) Assignee: EL-MUL TECHNOLOGIES LTD., Rehovot (IL)

( * ) Notice: Subject to any disclaimer, the term of this patent is extended or adjusted under 35 U.S.C. 154(b) by 0 days.

(21) Appl. No.: 15/253,905

(22) Filed: Sep. 1, 2016

(65) Prior Publication Data

US 2017/0069459 A1 Mar. 9, 2017

Related U.S. Application Data

(60) Provisional application No. 62/214,088, filed on Sep. 3, 2015.

(51) Int. Cl.
*H01J 37/24* (2006.01)
*H01J 37/244* (2006.01)

(52) U.S. Cl.
CPC ..... *H01J 37/244* (2013.01); *H01J 2237/2443* (2013.01)

(58) Field of Classification Search
CPC .......... H01J 37/244; H01J 2237/2443
See application file for complete search history.

(56) References Cited

U.S. PATENT DOCUMENTS

| 5,652,429 A * | 7/1997 | Genna ............ G01T 1/1642 250/368 |
| 5,990,483 A | 11/1999 | Shariv et al. |
| 6,236,053 B1 | 5/2001 | Shariv |
| 6,545,277 B1 | 8/2003 | Kella et al. |

(Continued)

FOREIGN PATENT DOCUMENTS

| WO | WO-2005-015599 | 2/2005 |
| WO | WO-2006-120005 | 11/2006 |
| WO | WO-2009-144727 | 12/2009 |

OTHER PUBLICATIONS

Frach et al. 'The Digital Silicon Photomultiplier—Principle of Operation and Intrinsic Detector Performance' 2009 IEEE Nuclear Science Symnposium Conference Record, p. 1959-1965.*

(Continued)

*Primary Examiner* — Eliza W Osenbaugh-Stewar
(74) *Attorney, Agent, or Firm* — Alphapatent Associates, Ltd; Daniel J. Swirsky

(57) ABSTRACT

An electron detector assembly configured for detecting electrons emitted from a sample irradiated by an electron beam, comprising a scintillator including a scintillator layer, the scintillator layer emitting light signals corresponding to impingement of electrons thereupon, a light guide plate coupled to the scintillator layer and comprising a peripheral surface, and a single or plurality of silicon photomultiplier devices positioned upon the peripheral surface and arranged perpendicularly or obliquely relative to the scintillating surface, the silicon photomultiplier device being configured to yield an electrical signal from an electron impinging upon the scintillator layer.

21 Claims, 8 Drawing Sheets

(56) References Cited

U.S. PATENT DOCUMENTS

| | | | |
|---|---|---|---|
| 7,180,060 B2 | 2/2007 | Chefetz et al. | |
| 7,417,235 B2 | 8/2008 | Schon et al. | |
| 7,847,268 B2 | 12/2010 | Shofman et al. | |
| 8,222,600 B2 | 7/2012 | Zarchin et al. | |
| 8,729,471 B2 | 5/2014 | Barbi et al. | |
| 9,076,632 B2 | 7/2015 | Reinhorn et al. | |
| 9,362,086 B2 | 7/2016 | Tuma et al. | |
| 2008/0315094 A1* | 12/2008 | Wang | H01J 37/244 250/310 |
| 2009/0309021 A1 | 12/2009 | Schon et al. | |
| 2010/0140471 A1* | 6/2010 | Kazumori | H01J 37/153 250/307 |
| 2011/0133082 A1 | 6/2011 | Choi et al. | |
| 2012/0025074 A1* | 2/2012 | Barbi | G01T 1/2018 250/307 |
| 2012/0273677 A1* | 11/2012 | Tuma | H01J 37/145 250/307 |
| 2013/0234032 A1* | 9/2013 | Wang | H01J 37/244 250/368 |
| 2014/0117484 A1 | 5/2014 | Yamamoto et al. | |
| 2016/0086765 A1 | 3/2016 | Chefetz et al. | |

OTHER PUBLICATIONS

EPO search report in EP 16001919.6, dated Jan. 23, 2017.

\* cited by examiner

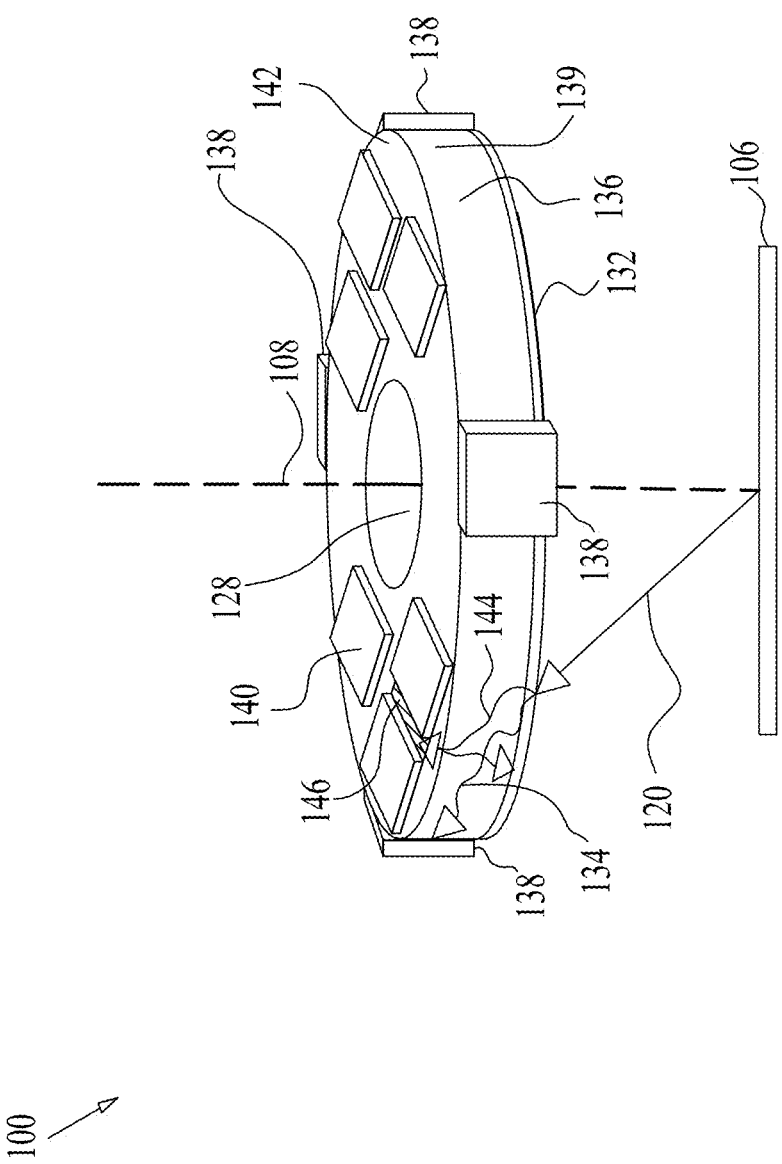

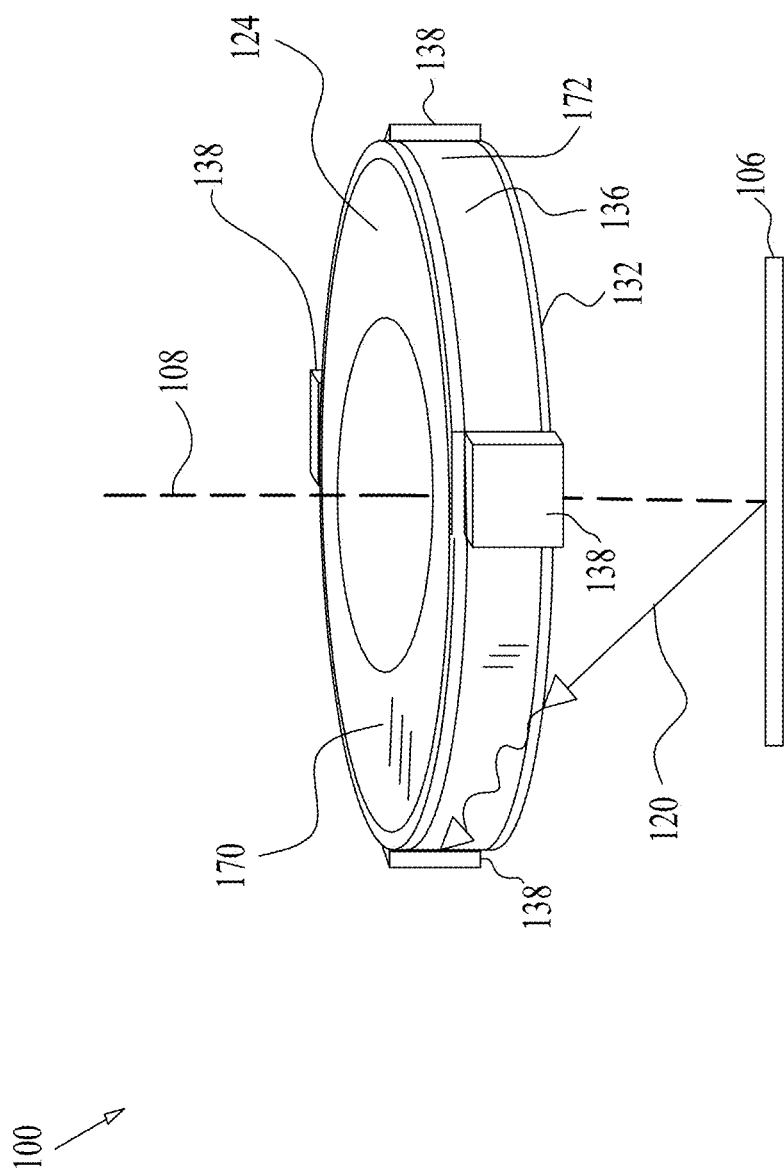

DETECTION ASSEMBLY, SYSTEM AND METHOD

CROSS-REFERENCE TO RELATED APPLICATIONS

This Application claims priority benefit from U.S. Provisional Application No. 62/214,088, filed Sep. 3, 2015, titled "In-Chamber BSE Detector Comprising In-Vacuum Scintillator and Photon Detector" the disclosure of which is incorporated herein by reference in its entirety.

TECHNICAL FIELD

This disclosure relates generally to systems for detecting charged particles emitted from a sample and, more particularly, to detecting electrons emitted from a sample irradiated by an electron beam.

BACKGROUND

Back Scattered Electrons (BSE) and Secondary Electrons (SE), can be emitted from a sample upon irradiation thereof by an electron beam within a microscope. Detecting BSE and SE can reveal material and surface properties of the irradiated sample. Common BSE and SE detectors include semiconductor diode detectors that produce an electric current upon an electron traversing thereon or Robinson-type detectors wherein electrons strike a scintillator layer producing photons transmitted through a light guide to a light sensor.

The semiconductor diode detector is speed limited and produces high noise and is thus less suitable for high scanning rate performance. Moreover, for SE detection, which requires operation at high voltages, use of semiconductor diode detector is undesirable. The Robinson-type detector extracts the signal via a rigid light guide through a bulky vacuum flange crowding the chamber of the microscope and imposing mechanical restrictions on the detection system. Its unidirectional light guide creates non-uniformity in the signal received from the electrons. Few light guide configurations are also possible, but impose higher complexity and cost.

SUMMARY

The following summary of the invention is included in order to provide a basic understanding of some aspects and features of the disclosure. This summary is not an extensive overview of the disclosure and as such, it is not intended to particularly identify key or critical elements of the disclosure or to delineate the scope of the disclosure. Its sole purpose is to present some concepts of the disclosure in a simplified form as a prelude to the more detailed description that is presented below.

There is provided in accordance with an embodiments of the present disclosure, an electron detector assembly configured for detecting electrons emitted from a sample irradiated by an electron beam, comprising: a scintillator comprising a scintillator layer, the scintillator layer emitting light signals corresponding to impingement of electrons thereupon, a light guide plate coupled to the scintillator layer and comprising a peripheral surface, and a single or plurality of silicon photomultiplier devices positioned upon the peripheral surface and arranged perpendicularly or obliquely relative to the scintillating surface, the silicon photomultiplier device being configured to yield an electrical signal from an electron impinging upon the scintillator layer.

In some embodiments, the electrons comprise at least one of backscatter electrons (BSE), secondary electrons (SE), tertiary electrons (SE3) or a combination thereof. In some embodiments, the SE comprise accelerated SE.

In some embodiments, the light guide plate is formed with a central bore to allow the electron beam to propagate therethrough. The central bore may be formed with an internal perpendicular wall in respect to the scintillator layer. Alternatively, the central bore may be formed with an internal inclined wall in respect to the scintillator layer. In some embodiments, the central bore is formed with an internal wall coated with a partial or complete reflective/diffusive layer.

In some embodiments, an additional silicon photomultiplier device is positioned on a top surface of the electron detector assembly and arranged parallel to the scintillator layer. In some embodiments, the assembly comprises a top surface and the assembly is formed with a partial or complete reflective/diffusive coating at least one of the peripheral surface and the top surface or a combination thereof.

In some embodiments, the assembly is configured to facilitate detection of a spatial location of the electrons according to the spatial location of an input signal generated by electrons impinging upon the scintillator layer.

In some embodiments, a voltage supplier is provided to bias the scintillator layer relative to the sample thereby accelerating secondary electrons (SE) to the detector, or tertiary electrons (SE3) to the detector or a combination thereof.

In some embodiments, the assembly is positioned intermediate a pole piece of an electron beam column and the sample. Alternatively, or in addition thereto, the assembly is positioned within the electron beam column. In some embodiments, the central bore of the assembly is positioned in alignment with the electron beam.

In some embodiments, the assembly is positioned at a lateral distance away and off-axis from an electron beam column.

In some embodiments, the assembly is configured to detect ions emitted from the sample.

There is provided in accordance with an embodiments of the present disclosure, an electron detection system, comprising: an electron beam irradiating a sample, an electron detector assembly for detecting electrons emitted from the sample comprising: a scintillator comprising a scintillator layer, the scintillator layer emitting light signals corresponding to impingement of electrons thereupon, a light guide plate coupled to the scintillator and comprising a peripheral surface, and a single or plurality of silicon photomultiplier devices positioned upon the peripheral surface and arranged perpendicularly or obliquely relative to the scintillating surface, the silicon photomultiplier device being configured to yield an electrical signal from electrons impinging upon the scintillator layer.

There is provided in accordance with an embodiments of the present disclosure, a method for detecting electrons emitted from a sample irradiated by an electron beam, comprising irradiating a sample by an electron beam, providing an electron detector assembly comprising: a scintillator comprising a scintillator layer, the scintillator layer emitting light signals corresponding to impingement of electrons thereupon, a light guide plate coupled to the scintillator and comprising a peripheral surface, and a single or plurality of silicon photomultiplier devices positioned upon the peripheral surface and arranged perpendicularly or obliquely to the scintillating surface, the silicon photomultiplier device being configured to yield an electrical signal from electrons impinging upon the scintillator layer, thereby detecting electrons emitted from the sample.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 4 is a simplified pictorial illustration of an electron detection system constructed and operative in accordance with an embodiment of the present disclosure;

FIG. 5 is a simplified pictorial illustration of an electron detection system constructed and operative in accordance with an embodiment of the present disclosure;

DETAILED DESCRIPTION

In the following description, various aspects of the present invention will be described with reference to different embodiments. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Figure 1A:
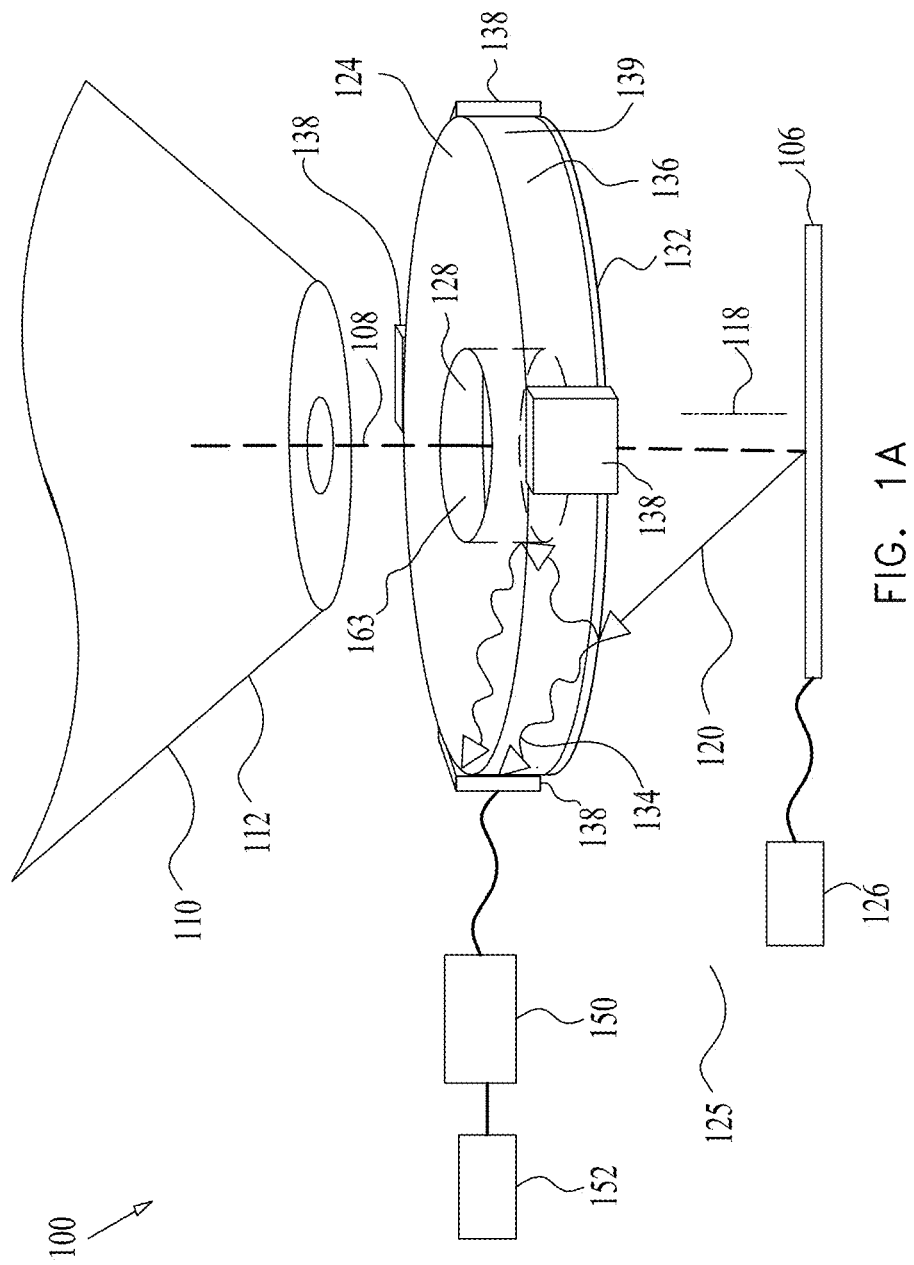
FIGS. 1A and 1B are each a simplified pictorial illustration of an electron detection system constructed and operative in accordance with an embodiment of the present disclosure.

FIGS. 1A-6 are each a simplified pictorial illustration of an electron detection system constructed and operative in accordance with an embodiment of the present disclosure. As seen in FIG. 1A, an electron detection system 100 is configured to detect electrons emitted from a sample 106. The sample 106 is irradiated by an electron beam 108 emanating from a pole piece 110 of an electron beam column 112 and forming a beam path along a beam axis 118.

Irradiating the sample 106 by electron beam 108 stimulates emission of charged particles from the sample 106. The emitted particles comprise, inter alia, electrons 120 which may include, secondary electrons (SE), backscattered electrons (BSE), emitted from the sample 106 at a plurality of dispersion angles and/or tertiary electrons (SE3).

In some embodiments, the electrons 120 are detected by an electron detector 124 configured to detect electrons impinging thereupon and yield an electrical signal therefrom. (The detector 124 may be shown not to scale).

In some embodiments, the emitted electrons 120 comprise BSE, typically emitted from the sample 106 at energies from 50 eV to the energy level of the electron beam 108. In some embodiments, emitted electrons 120 comprise SE, which typically include electrons emitted from the sample at energies below 50 eV, with most electrons emitted at energies between 1 eV-6 eV. In addition to the emitted BSE and/or the SE, SE3 may be emitted from other surfaces within the electron detection system 100 in response to impingement of SE or BSE on these surfaces (e.g. the pole piece 100, walls of a vacuum chamber 125 housing the electron beam column 112).

The sample 106 (or the detector 124 or any other suitable element in the electron detection system 100) may be negatively biased with an appropriate voltage in respect to a scintillator layer 132, thereby propelling SE emitted from the sample 106 and/or SE3 emitted from any location in the electron detection system 100, to accelerate to the scintillator layer 132 and thus be detected by detector 124. A voltage supplier 126 may be provided.

In some embodiments, the electron detector 124 may be formed with a central bore 128 to allow the electron beam to propagate therethrough to the sample 106. The electron detector 124 may comprise a scintillator layer 132 on an underside proximal to the sample 106 and is configured to convert electrons 120 impinging thereon to light signals, namely photons 134. The scintillator layer 132 may be coupled to or deposited on a light guide plate 136, transmitting the light to a light sensor, thereby yielding an electrical signal from an electron impinging upon the scintillator layer 132. The light guide plate 136 may be formed of any suitable light transmitting material, such as glass or plastic or scintillating light transmitting crystal (e.g. organic, inorganic etc.), the same or different from the material forming the scintillator layer 132. The scintillator layer 132 may comprise any suitable material such as powder, a crystal, a quantum well device or a quantum dot device, for example. The light guide plate 136 and/or the scintillator layer 132 may be formed in any shape suitable for a detector, such as an annular disk or ring, for example.

In accordance with an embodiment of the present disclosure the light sensor may comprise a single or a plurality of silicon photomultiplier devices 138. The silicon photomultiplier devices 138 may be positioned unparallel and angled in respect to the plane of the scintillator layer 132, such as being arranged perpendicularly or obliquely in respect to the scintillator layer 132. As seen in FIGS. 1A-6, the silicon photomultiplier devices 138 are placed generally orthogonally to the scintillator layer 132 on a peripheral surface 139 of the light guide plate 136. Though it is appreciated that the scintillator layer 132 may be placed at any angular distance relative to the scintillator layer 132.

In some embodiments, optional additional silicon photomultiplier devices 140 may be placed parallel to the scintillator layer 132 on a top surface 142 in addition to the angularly placed silicon photomultiplier devices 138, as seen in FIG. 4.

Constructing a detector 124 with angularly placed silicon photomultiplier devices 138 relative to the scintillator layer 132 facilitates higher photon collection than placing the silicon photomultiplier devices parallel to the scintillator layer 132 only. As illustrated in FIG. 4, a photon, here referenced as photon 144, propagating from the scintillator layer 132 may impinge upon a "dead region" 146 on top surface 142 formed intermediate the parallel silicon photomultiplier devices 140. Such a photon 144 remains undetected by the parallel silicon photomultiplier devices 140. Yet photons 134 which impinge the light guide surfaces which are unparallel to scintillator layer 132 (e.g. the peripheral surface 139 or internal inclined wall 160 (FIG. 2)), which are diffusive or reflective or both, are reflected or diffused to disperse in many directions and thus reach at least one of the angled silicon photomultiplier devices 138. Accordingly, the collection efficiency of the detector 124 formed with angled silicon photomultiplier devices 138 is improved.

Furthermore, a photon 134 impinging upon a "dead region" 146 or any other area on top surface 142, may be reflected back to the scintillator layer 132 and absorbed, thereby standing undetected. Whilst photons 134 impinging upon the peripheral surface 139 or internal inclined wall 160 are typically reflected and/or diffused (such as when peripheral surface 139 or internal inclined wall 160 is coated with a reflective/diffusive layer) to other regions on the peripheral surface 139 and detected by the angled silicon photomultiplier devices 138, thereby enhancing the collection uniformity.

Figure 1B:
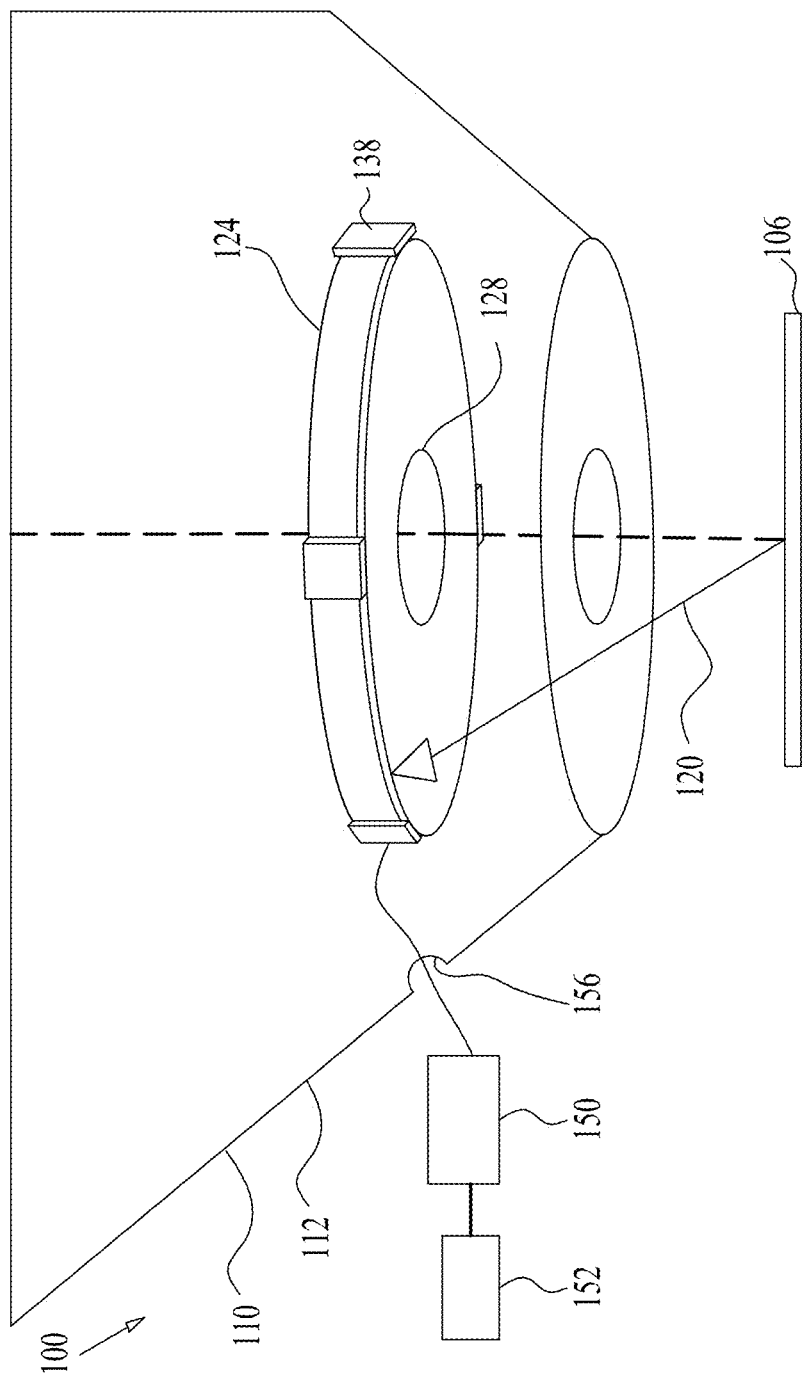

Moreover, in some embodiments, maintaining a relatively thin detector 124 (in respect to the longitudinal axis 118) allows placing the detector 124 unobstructedly under the pole piece 110, as seen in FIG. 1A or within the electron beam column 112, as seen in FIG. 1B.

The Silicon Photomultiplier device 138, may be commercially available typically in sizes of squares of 1 to 6 mm sides, integrates a dense array of relatively small, electrically and optically isolated Geiger-mode silicon photodiodes. Each photodiode element in the array is referred to as a microcell. Typically numbering between 100 and 10,000 per square millimeter, each microcell has its own quenching resistor. The signals of all or most microcells are then summed to form the output of the Silicon Photomultiplier device 138. Each microcell detects photons by discharging its charge generally identically and independently. The size of the silicon photomultiplier device 138 may be selected according to the desired the array size.

The silicon photomultiplier device 138 typically benefits from high gain and good photon detection efficiency (e.g. with an efficiency of about 20% and higher, such as in a range of 20%-45%), along with the physical advantage of compactness, ruggedness and magnetic insensitivity. The silicon photomultiplier device 138 achieves its high gain (e.g. approximately in the range of $10^4$-$10^6$) with very low bias voltages (e.g. from about 30V to about 80V) and the noise may be almost entirely at the single photon level. Because of the high degree of uniformity between the microcells the silicon photomultiplier device 138 is capable of discriminating the precise number of photoelectrons detected as distinct, discrete levels at an output node. Furthermore, the silicon photomultiplier device 138 provides excellent timing resolution with a fast risetime (e.g. in the order of sub-nanoseconds). In some embodiments, the ability to measure a well resolved photoelectron spectrum is a feature of the silicon photomultiplier device 138 which is generally challenging to achieve with a PMT due to the variability in the gain, or excess noise.

In some embodiments, the resultant signal from the silicon photomultiplier device 138 may be conditioned by a pre-amplifier module 150 (FIG. 1A) and transmitted to a signal processing unit 152 for further processing and analysis thereof. In some embodiments, and the signal generated by the silicon photomultiplier device 138 is based on an intensity of the electrons that impinged on the scintillator layer 132, and the signal processing unit 152 and associated electronic circuitry is structured to generate an image of the specimen 106 of the signal generated by the single or plurality of silicon photomultiplier devices 138.

Figure 7E:
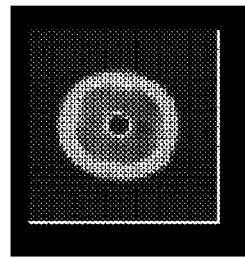
FIGS. 7A-7E are simplified graphical illustrations of electrons detected by an electron detector within an electron detection system of FIG. 2.
Figure 7B:
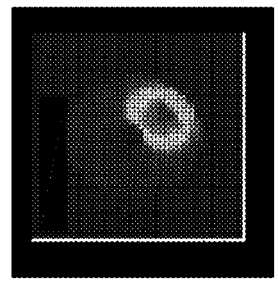
Figure 7D:
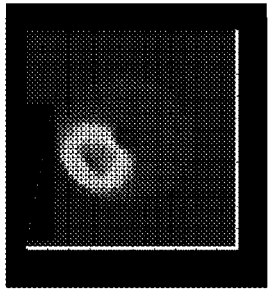
Figure 7A:
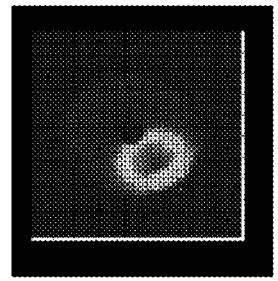
Figure 7C:
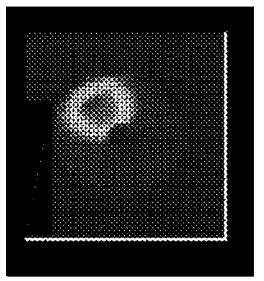

In some embodiments, a plurality of silicon photomultiplier devices 138 may be equidistantly or non-equidistantly placed around the peripheral surface 139. This arrangement facilitates detection of the spatial location of the electrons 120 according to the spatial location of the input signal generated by an electron 120 impinging upon the scintillator layer 132. In FIGS. 7A-7E there are shown graphical illustrations of BSEs detected by an electron detector 124 equipped with four equidistantly placed silicon photomultiplier devices 138. Each individual silicon photomultiplier device 138 collects signals mainly from a single quadrat segment of the scintillator layer 132. Thus each of the scans shown in FIGS. 7A-7D correspond to signals collected by a first, second, third and fourth silicon photomultiplier device 138 each placed at a corresponding first, second, third and fourth quadrat segment. FIG. 7E shows the sum of the respective signals shown in FIGS. 7A-7D.

In FIG. 1A the detector 124 is shown placed intermediate the pole piece 110 and the sample 106. In some embodiments, the detector 124 may be placed within the electron beam column 112, as seen in FIG. 1B. Communication with the pre-amplifier module 150 and/or the signal processing unit 152 may be via wires positioned through an aperture 156 or feed-through formed in the electron beam column 112 or any other existing aperture.

Figure 2:
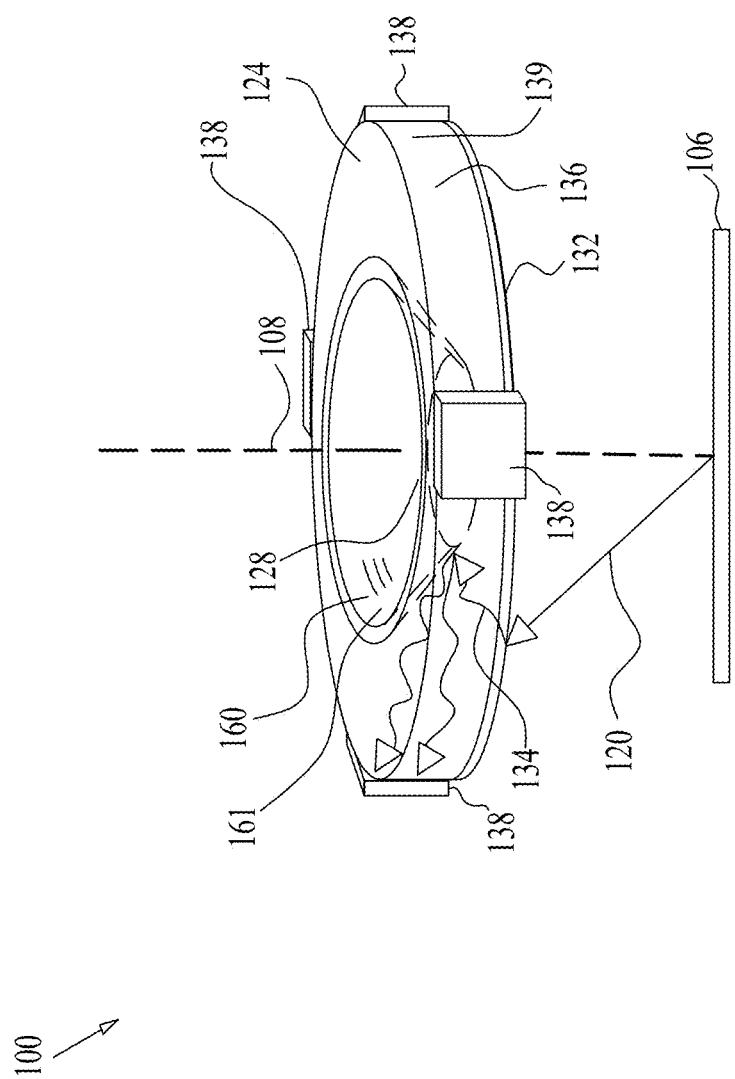
FIG. 2 is a simplified pictorial illustration of an electron detection system constructed and operative in accordance with an embodiment of the present disclosure.

Turning to FIG. 2 it is seen that the central bore 128 may be formed with an internal inclined wall 160 to further enhance the collection efficiency of the detector. In some embodiments, the inclined wall 160 may be coated by a reflective or diffusive aluminum layer 161 (or any other metallic or reflective/diffusive material), which can reflect or diffuse additional light rays (produced in the scintillator layer 132) towards the silicon photomultiplier device 138. The inclined walls 160 may reduce the instances of internal reflection in the light guide plate 136 and improve the light coupling to the silicon photomultiplier device 138, thereby increasing the light collection efficiency of the detector 124.

It is noted that the internal wall 163 of central bore 128 of FIG. 1A may be lined with a reflective or diffusive layer.

Figure 3D:
FIGS. 3A-3E are each a simplified cross sectional illustration of elements of an electron detection system constructed and operative in accordance with an embodiment of the present disclosure.
Figure 3E:
Figure 3A:
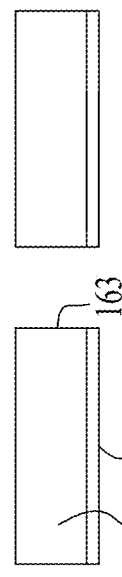
Figure 3B:
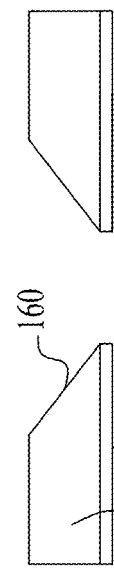
Figure 3C:
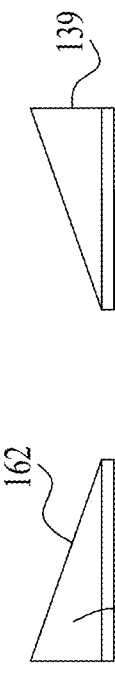

The light guide plate 136 may be formed in any suitable shape, as seen in FIGS. 3A-3E showing exemplary, non-limiting, cross sectional options of the light guide plate 136. FIG. 3A is the cross sectional illustration of the light guide plate 136 of FIG. 1. FIG. 3B is the cross sectional illustration of the light guide plate 136 of FIG. 2. FIG. 3C is a cross sectional illustration of a light guide plate 136 formed with inclined walls 162 extending from peripheral surface 139. FIG. 3D is a cross sectional illustration of a light guide plate 136 formed with curved walls 164. FIG. 3E is a cross sectional illustration of a light guide plate 136 formed with both inclined internal walls 166 and inclined external walls 168 (also referenced as peripheral surface 139).

As seen in FIG. 5, the detector 124 may comprise a reflective or diffusive layer formed of any suitable reflective or diffusive material, such as aluminum, for example. The reflective/diffusive layer may comprise an upper reflective/diffusive layer 170, placed partially or completely upon top surface 142 (FIG. 4), alternatively or additionally, the reflective/diffusive layer may comprise a peripheral reflective/diffusive layer 172, placed partially or completely around peripheral surface 139.

Figure 6:
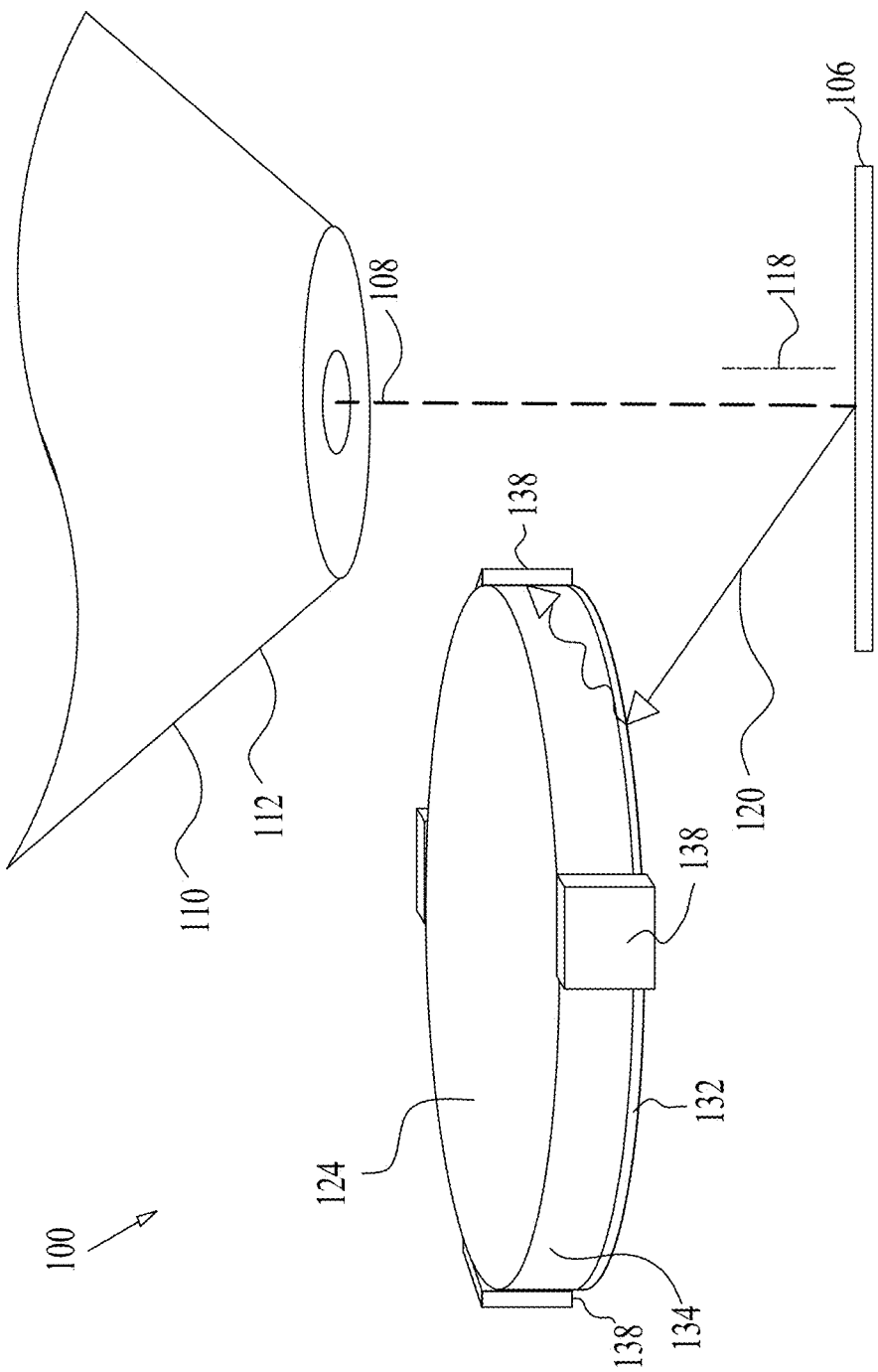
FIG. 6 is a simplified pictorial illustration of an electron detection system constructed and operative in accordance with an embodiment of the present disclosure.

The central bore 128 of the detector 124 is shown in FIGS. 1A and 1B to be aligned with the electron beam 108, which longitudinally propagates therethrough to the sample 106. Turning to FIG. 6 it is seen that in some embodiments, the detector 124 may be positioned at a lateral distance (perpendicular or oblique to axis 118) away and off-axis from electron beam column 112, thereby obviating bore 128.

In some embodiments, the detector 124 may be placed at a longitudinal distance along axis 118, as seen in FIG. 1A. Alternatively, the detector 124 may be affixed to the pole piece 110 and positioned in close proximity to an exit aperture of the column 112.

In some embodiments, the detector 124 may be configured to detect neutral, positive and/or negative ions. In such an embodiment, an ion-to electron convertor may be provided intermediate the sample 106 and the detector 124 and optionally biasing the detector 124 and/or the sample 106.

In some embodiments, the electron beam column 112 may be replaced by a Focused Ion Beam (FIB) column irradiating the sample 106 with an ion beam. The resultant SE or BSE or SE3 or ions may be detected by detector 124. In some embodiments, the resultant SE or SE3 accelerated by several kV potential may be detected by detector 124 configured to detect electrons.

In some embodiments, the photon sensor may comprise a photo-diode, an avalanche photo-diode (APD), a Geiger mode APD, a multi-pixel photon detector, a solid state photomultiplier, such a silicon photomultiplier described above and a combination thereof.

In some embodiments, the electron detection system 100 comprises one or more detectors 124. The detectors 124 may be positioned in any suitable location, such as under the pole piece 110 (FIG. 1A) within the electron beam column 112 (FIG. 1B) and/or at a lateral distance away from the electron beam path (FIG. 6) or a combination thereof.

Example embodiments of the devices, systems and methods have been described herein. As may be noted elsewhere, these embodiments have been described for illustrative purposes only and are not limiting. Other embodiments are possible and are covered by the disclosure, which will be apparent from the teachings contained herein. Thus, the breadth and scope of the disclosure should not be limited by any of the above-described embodiments but should be defined only in accordance with claims supported by the present disclosure and their equivalents. Moreover, embodiments of the subject disclosure may include methods, systems and devices which may further include any and all elements/features from any other disclosed methods, systems, and devices, including any and all features corresponding to translocation control. In other words, features from one and/or another disclosed embodiment may be interchangeable with features from other disclosed embodiments, which, in turn, correspond to yet other embodiments. Furthermore, one or more features/elements of disclosed embodiments may be removed and still result in patentable subject matter (and thus, resulting in yet more embodiments of the subject disclosure).

What is claimed is:

1. An electron detector assembly configured for detecting electrons emitted from a sample irradiated by an electron beam, comprising:
    a scintillator comprising a scintillator layer, the scintillator layer emitting light signals corresponding to impingement of electrons thereupon;
    a light guide plate coupled to the scintillator layer and comprising a peripheral surface, wherein the light guide plate is formed as an annular disk; and
    a single or plurality of silicon photomultiplier devices, each device formed with a photomultiplication surface, the silicon photomultiplier device being positioned upon the peripheral surface and arranged with its photomultiplication surface perpendicularly or obliquely relative to the scintillating surface, the silicon photomultiplier device being configured to yield an electrical signal from an electron impinging upon the scintillator layer.

2. An electron detector assembly according to claim 1, wherein the electrons comprise at least one of backscatter electrons (BSE), secondary electrons (SE), tertiary electrons (SE3) or a combination thereof.

3. An electron detector assembly according to claim 2, wherein the SE comprise accelerated SE.

4. An electron detector assembly according to claim 1, wherein the light guide plate is formed with a central bore to allow the electron beam to propagate therethrough.

5. An electron detector assembly according to claim 4, wherein the central bore is formed with an internal perpendicular wall in respect to the scintillator layer.

6. An electron detector assembly according to claim 4, wherein the central bore is formed with an internal inclined wall in respect to the scintillator layer.

7. An electron detector assembly according to claim 4, wherein the central bore is formed with an internal wall coated with a partial or complete reflective/diffusive layer.

8. An electron detector assembly according to claim 1, wherein an additional silicon photomultiplier device is positioned on a top surface of the electron detector assembly and arranged parallel to the scintillator layer.

9. An electron detector assembly according to claim 1, wherein the assembly comprises a top surface, the assembly is formed with a partial or complete reflective/diffusive coating at least one of the peripheral surface and the top surface or a combination thereof.

10. An electron detector assembly according to claim 1, wherein the assembly is configured to facilitate detection of a spatial location of the electrons according to the spatial location of an input signal generated by electrons impinging upon the scintillator layer.

11. An electron detector assembly according to claim 1, wherein a voltage supplier is provided to bias the scintillator layer relative to the sample thereby accelerating secondary electrons (SE) to the detector assembly, or tertiary electrons (SE3) to the detector assembly or a combination thereof.

12. An electron detector assembly according to claim 1, wherein the assembly is positioned intermediate a pole piece of an electron beam column and the sample.

13. An electron detector assembly according to claim 1, wherein the assembly is positioned within an electron beam column.

14. An electron detector assembly according to claim 1, wherein a central bore of the detector assembly is positioned in alignment with the electron beam.

15. An electron detector assembly according to claim 1, wherein the assembly is positioned at a lateral distance away and off-axis from an electron beam column.

16. An electron detector assembly according to claim 1, wherein the assembly is configured to detect ions emitted from the sample.

17. An electron detection system, comprising:
    an electron beam irradiating a sample;
    an electron detector assembly for detecting electrons emitted from the sample comprising:

a scintillator comprising a scintillator layer, the scintillator layer emitting light signals corresponding to impingement of electrons thereupon;

a light guide plate coupled to the scintillator and comprising a peripheral surface, wherein the light guide plate is formed as an annular disk; and a single or plurality of silicon photomultiplier devices, each formed with a photomultiplication surface, the silicon photomultiplier device being positioned upon the peripheral surface and arranged with its photomultiplication surface perpendicularly or obliquely relative to the scintillating surface, the silicon photomultiplier device being configured to yield an electrical signal from electrons impinging upon the scintillator layer.

18. An electron detection system according to claim 17, wherein the electrons comprise at least one of backscatter electrons (BSE), secondary electrons (SE), tertiary electrons (SE3) or a combination thereof.

19. An electron detection system according to claim 17, wherein the electron detector assembly is formed with a central bore and the central bore is formed with an internal inclined wall in respect to the scintillator layer.

20. A method for detecting electrons emitted from a sample irradiated by an electron beam, comprising:
   irradiating a sample by an electron beam;
   providing an electron detector assembly comprising:
      a scintillator comprising a scintillator layer, the scintillator layer emitting light signals corresponding to impingement of electrons thereupon;
      a light guide plate coupled to the scintillator and comprising a peripheral surface, wherein the light guide plate is formed as an annular disk; and
      a single or plurality of silicon photomultiplier devices, each device formed with a photomultiplication surface, the silicon photomultiplier device being positioned upon the peripheral surface and arranged with its photomultiplication surface perpendicularly or obliquely relative to the scintillating surface, the silicon photomultiplier device being configured to yield an electrical signal from electrons impinging upon the scintillator layer,
   thereby detecting electrons emitted from the sample.

21. An electron detector assembly configured for detecting electrons emitted from a sample irradiated by an electron beam emanating from an electron beam column and forming a beam path along a beam axis, comprising:
   a scintillator comprising a scintillator layer, the scintillator layer emitting photons corresponding to impingement of the electrons thereupon;
   a light guide plate coupled to the scintillator layer and comprising a peripheral surface, wherein the light guide plate is formed as an annular disk; and
   at least one microcell of a tubeless silicon photomultiplier device, each microcell being positioned upon the peripheral surface and arranged perpendicularly or obliquely relative to the scintillating surface, the microcell being configured to:
      detect at least a single photon propagating angularly in respect to the beam axis, and
      yield an electrical signal from the photon impinging thereon.

* * * * *